United States Patent
Lin et al.

(10) Patent No.: US 12,148,486 B2
(45) Date of Patent: Nov. 19, 2024

(54) READ VOLTAGE ADJUSTMENT METHOD, MEMORY STORAGE DEVICE AND MEMORY CONTROL CIRCUIT UNIT

(71) Applicant: PHISON ELECTRONICS CORP., Miaoli (TW)

(72) Inventors: Hsiao-Yi Lin, Yilan County (TW); Shih-Jia Zeng, Hsinchu (TW); Chen Yang Tang, Taoyuan (TW); Shi-Chieh Hsu, Taichung (TW); Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 143 days.

(21) Appl. No.: 18/181,546

(22) Filed: Mar. 10, 2023

(65) Prior Publication Data

US 2024/0265983 A1    Aug. 8, 2024

(30) Foreign Application Priority Data

Feb. 2, 2023   (TW) ................. 112103678

(51) Int. Cl.
*G11C 16/00* (2006.01)
*G11C 16/10* (2006.01)
(Continued)

(52) U.S. Cl.
CPC ........ *G11C 16/3459* (2013.01); *G11C 16/102* (2013.01); *G11C 16/26* (2013.01); *G11C 16/3404* (2013.01)

(58) Field of Classification Search
CPC ..... G11C 16/26; G11C 29/021; G11C 29/028; G11C 29/44; G11C 16/349; G11C 29/52; G11C 16/0483; G11C 11/5642; G11C 16/10; G11C 16/28; G11C 16/3418; G11C 11/4091; G11C 11/5671; G11C 16/12; G11C 16/3481; G11C 2029/0411; G11C 2211/5632; G11C 2211/5648;
(Continued)

(56) References Cited

U.S. PATENT DOCUMENTS 9,934,078 B2 * 4/2018 Guo .................. G06F 9/543
2013/0016562 A1  1/2013 Mun

OTHER PUBLICATIONS

"Office Action of Taiwan Counterpart Application", issued on Jan. 4, 2024, p. 1-p. 9.

* cited by examiner

*Primary Examiner* — Thong Q Le
(74) *Attorney, Agent, or Firm* — JCIPRNET

(57) ABSTRACT

A read voltage adjustment method, a memory storage device, and a memory control circuit unit are disclosed. The method includes: sending a write command sequence instructing to program a plurality of first memory cells in a rewritable non-volatile memory module; sending a first read command sequence instructing to read the programmed first memory cells using a first read voltage level to obtain first count information; obtaining first compensation information corresponding to the first read voltage level, wherein the first compensation information reflects a deviation in evenly programming the first memory cells to a plurality of states; and adjusting the first read voltage level according to the first count information, the first compensation information, and default count information corresponding to the first read voltage level.

21 Claims, 7 Drawing Sheets

(51) Int. Cl.
*G11C 16/26* (2006.01)
*G11C 16/34* (2006.01)

(58) Field of Classification Search
CPC ......... G11C 29/36; G11C 29/38; G11C 29/42; G11C 7/1012; G11C 7/1096; G11C 7/14; G11C 16/0466; G11C 16/08; G11C 16/3495; G11C 7/1006; G06F 3/0679; G06F 3/0604; G06F 11/1068; G06F 3/0619; G06F 12/0238; G06F 13/1668; G06F 2212/1016; G06F 2212/1032; G06F 2212/7201; G06F 2212/7202; G06F 3/0616; G06F 3/0625; G06F 3/0634; G06F 3/0655; G06F 3/0659; G06F 3/0688; G06F 11/1048; G06F 3/064
See application file for complete search history.

| Word line | RV(1) | RV(2) | RV(3) | RV(4) | RV(5) | RV(6) | RV(7) |
|---|---|---|---|---|---|---|---|
| WL(1) | 48 | −55 | 53 | 20 | 185 | 251 | 38 |
| WL(2) | 121 | 140 | 178 | 144 | −18 | 0 | −133 |
| ⋮ | ⋮ | ⋮ | ⋮ | ⋮ | ⋮ | ⋮ | ⋮ |
| WL(i) | ΔS(1) | ΔS(2) | ΔS(3) | ΔS(4) | ΔS(5) | ΔS(6) | ΔS(7) |
| ⋮ | ⋮ | ⋮ | ⋮ | ⋮ | ⋮ | ⋮ | ⋮ |

FIG. 10

Send a write command sequence instructing programming a plurality of first memory cells in a rewritable non-volatile memory module — S1101

Send a first read command sequence instructing reading the programmed first memory cells using a first read voltage level to obtain first count information — S1102

Obtain first compensation information corresponding to the first read voltage level — S1103

Adjust the first read voltage level according to the first count information, the first compensation information, and default count information corresponding to the first read voltage level — S1104

FIG. 11

READ VOLTAGE ADJUSTMENT METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 112103678, filed on Feb. 2, 2023. The entirety of the above-mentioned patent application is hereby incorporated by reference herein and made a part of this specification.

BACKGROUND OF THE INVENTION

Field of the Invention

The invention relates to a memory control technique, and more particularly, to a read voltage adjustment method, a memory storage device, and a memory control circuit unit.

Description of Related Art

Portable electronic devices such as smart phones and notebook computers have grown rapidly in the past few years, which has led to a rapid increase in consumer demand for storage media. Since a rewritable non-volatile memory module (such as a flash memory) has characteristics such as data non-volatility, power-saving, small size, and lack of mechanical structures, the rewritable non-volatile memory module is very suitable to be built into the various portable electronic devices provided above.

In a memory storage device in which one memory cell may store a plurality of bits, a plurality of default read voltage levels are used to read data stored in memory cells belonging to different states. However, after the memory storage device is used for a period of time, as the memory cells are worn out, these default read voltage levels may be significantly shifted relative to the threshold voltage distribution of the memory cells, even shifted to the extent that these default read voltage levels may be misjudged as read voltage levels for reading adjacent states. At this time, using a conventional read voltage adjustment mechanism may not correct read voltage levels correctly, thus shortening the service life of the memory storage device.

SUMMARY OF THE INVENTION

The invention provides a read voltage adjustment method, a memory storage device, and a memory control circuit unit that may improve the correction efficiency of the read voltage level.

An exemplary embodiment of the invention provides a read voltage adjustment method configured for a rewritable non-volatile memory module. The rewritable non-volatile memory module includes a plurality of memory cells. The read voltage adjustment method includes: sending a write command sequence, wherein the write command sequence instructs to program a plurality of first memory cells in the plurality of memory cells; sending a first read command sequence, wherein the first read command sequence instructs to read the programmed plurality of first memory cells using a first read voltage level to obtain first count information; obtaining first compensation information corresponding to the first read voltage level, and the first compensation information reflects a deviation in evenly programming the plurality of first memory cells to a plurality of states; and adjusting the first read voltage level according to the first count information, the first compensation information, and default count information corresponding to the first read voltage level.

An exemplary embodiment of the invention further provides a memory storage device including a connection interface unit, a rewritable non-volatile memory module, and a memory control circuit unit. The connection interface unit is configured to be coupled to a host system. The rewritable non-volatile memory module includes a plurality of memory cells. The memory control circuit unit is coupled to the connection interface unit and the rewritable non-volatile memory module. The memory control circuit unit is configured to: send a write command sequence, wherein the write command sequence instructs to program a plurality of first memory cells in the plurality of memory cells; send a first read command sequence, wherein the first read command sequence instructs to read the programmed plurality of first memory cells using a first read voltage level to obtain first count information; obtain first compensation information corresponding to the first read voltage level, and the first compensation information reflects a deviation in evenly programming the plurality of first memory cells to a plurality of states; and adjust the first read voltage level according to the first count information, the first compensation information, and default count information corresponding to the first read voltage level.

An exemplary embodiment of the invention further provides a memory control circuit unit configured to control a rewritable non-volatile memory module. The memory control circuit unit includes a host interface, a memory interface, and a memory management circuit. The host interface is configured to be coupled to a host system. The memory interface is configured to be coupled to the rewritable non-volatile memory module. The rewritable non-volatile memory module includes a plurality of memory cells. The memory management circuit is coupled to the host interface and the memory interface. The memory management circuit is configured to: send a write command sequence, wherein the write command sequence instructs to program a plurality of first memory cells in the plurality of memory cells; send a first read command sequence, wherein the first read command sequence instructs to read the programmed plurality of first memory cells using a first read voltage level to obtain first count information; obtain first compensation information corresponding to the first read voltage level, and the first compensation information reflects a deviation in evenly programming the plurality of first memory cells to a plurality of states; and adjust the first read voltage level according to the first count information, the first compensation information, and default count information corresponding to the first read voltage level.

Based on the above, after the plurality of first memory cells in the rewritable non-volatile memory module are programmed, the programmed first memory cells may be read using the first read voltage level to obtain the first count information. At the same time, the first compensation information corresponding to the first read voltage level may be obtained. In particular, the compensation information may reflect the deviation in evenly programming the first memory cells to the plurality of states. Then, the first read voltage level may be adjusted according to the first count information, the first compensation information, and the default count information corresponding to the first read voltage level. Thereby, the correction efficiency of the read voltage level may be improved.

BRIEF DESCRIPTION OF THE DRAWINGS

FIG. 10 is a schematic diagram of recording compensation information corresponding to different word lines shown according to an exemplary embodiment of the invention.

FIG. 11 is a flowchart of a read voltage adjustment method shown according to an exemplary embodiment of the invention.

DESCRIPTION OF THE EMBODIMENTS

In general, a memory storage device (also referred to as a memory storage system) includes a rewritable non-volatile memory module and a controller (also referred to as a control circuit). The memory storage device may be used with a host system, such that the host system may write data into the memory storage device or read data from the memory storage device.

Figure 1:
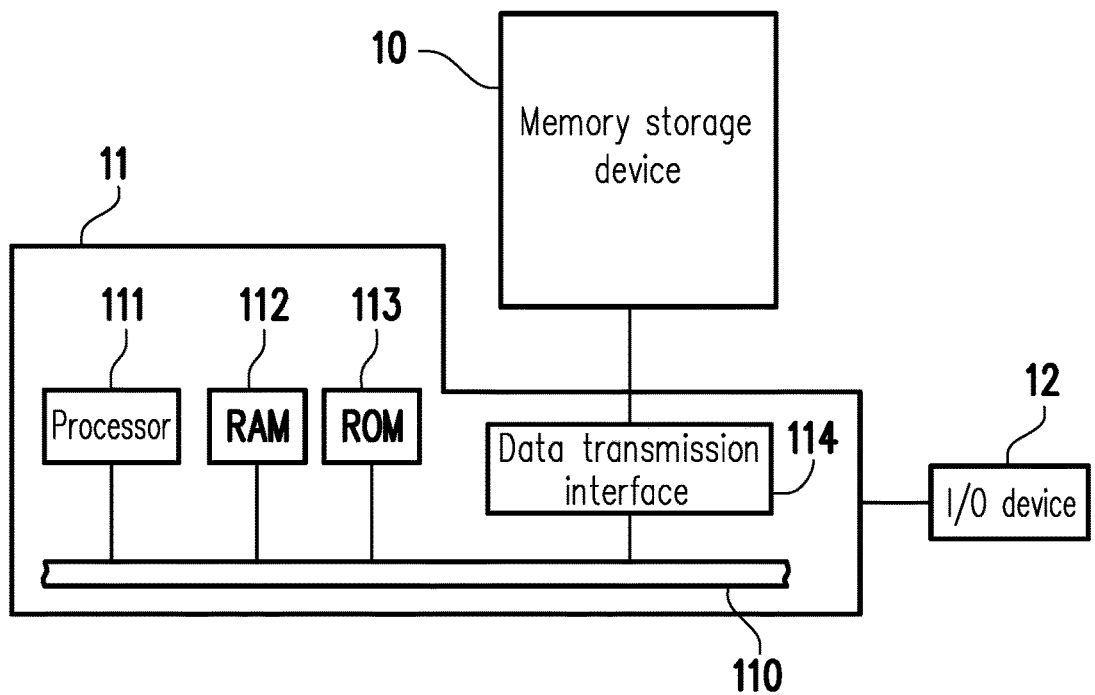
FIG. 1 is a schematic diagram of a host system, a memory storage device, and an input/output (I/O) device shown according to an exemplary embodiment of the invention.
Figure 2:
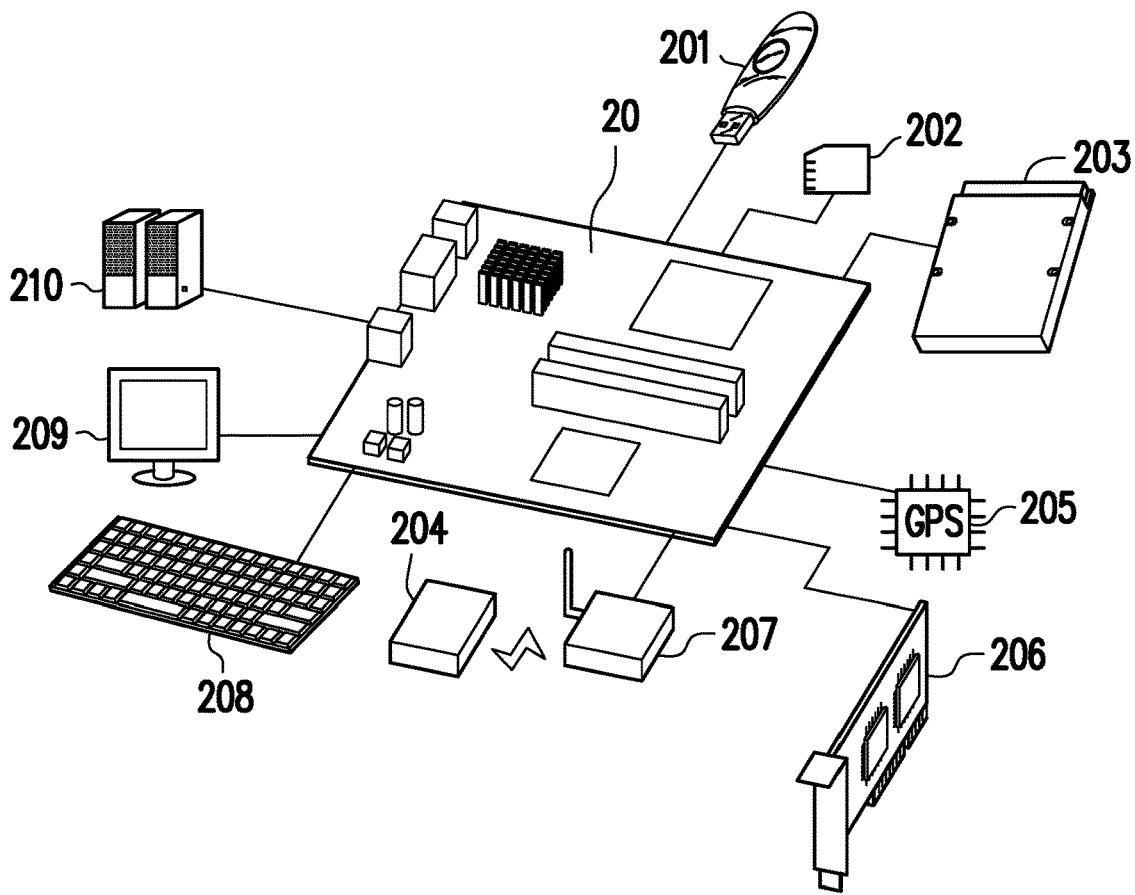
FIG. 2 is a schematic diagram of a host system, a memory storage device, and an I/O device shown according to another exemplary embodiment of the invention.

FIG. 1 is a schematic diagram of a host system, a memory storage device, and an input/output (I/O) device shown according to an exemplary embodiment of the invention. FIG. 2 is a schematic diagram of a host system, a memory storage device, and an I/O device shown according to an exemplary embodiment of the invention.

Referring to FIG. 1 and FIG. 2, a host system 11 may include a processor 111, a random-access memory (RAM) 112, a read-only memory (ROM) 113, and a data transmission interface 114. The processor 111, the RAM 112, the ROM 113, and the data transmission interface 114 may be coupled to a system bus 110.

In an exemplary embodiment, the host system 11 may be coupled to the memory storage device 10 via the data transmission interface 114. For example, the host system 11 may store data into the memory storage device 10 or read data from the memory storage device 10 via the data transmission interface 114. Moreover, the host system 11 may be coupled to the I/O device 12 via the system bus 110. For example, the host system 11 may send an output signal to the I/O device 12 or receive an input signal from the I/O device 12 via the system bus 110.

In an exemplary embodiment, the processor 111, the RAM 112, the ROM 113, and the data transmission interface 114 may be disposed on a motherboard 20 of the host system 11. The quantity of the data transmission interface 114 may be one or a plurality. The motherboard 20 may be coupled to the memory storage device 10 in a wired or wireless method via the data transmission interface 114.

In an exemplary embodiment, the memory storage device 10 may be, for example, a flash drive 201, a memory card 202, a solid-state drive (SSD) 203, or a wireless memory storage device 204. The wireless memory storage device 204 may be, for example, a memory storage device based on various wireless communication techniques such as a near-field communication (NFC) memory storage device, a wireless fax (WiFi) memory storage device, a Bluetooth memory storage device, or a low-power Bluetooth memory storage device (such as iBeacon). Moreover, the motherboard 20 may also be coupled to various I/O devices such as a global positioning system (GPS) module 205, a network interface card 206, a wireless transmission device 207, a keyboard 208, a screen 209, or a speaker 210 via the system bus 110. For example, in an exemplary embodiment, the motherboard 20 may access the wireless memory storage device 204 via the wireless transmission device 207.

In an exemplary embodiment, the host system 11 is a computer system. In an exemplary embodiment, the host system 11 may be any system that may substantially store data with the memory storage device. In an exemplary embodiment, the memory storage device 10 and the host system 11 may respectively include a memory storage device 30 and a host system 31 of FIG. 3.

Figure 3:
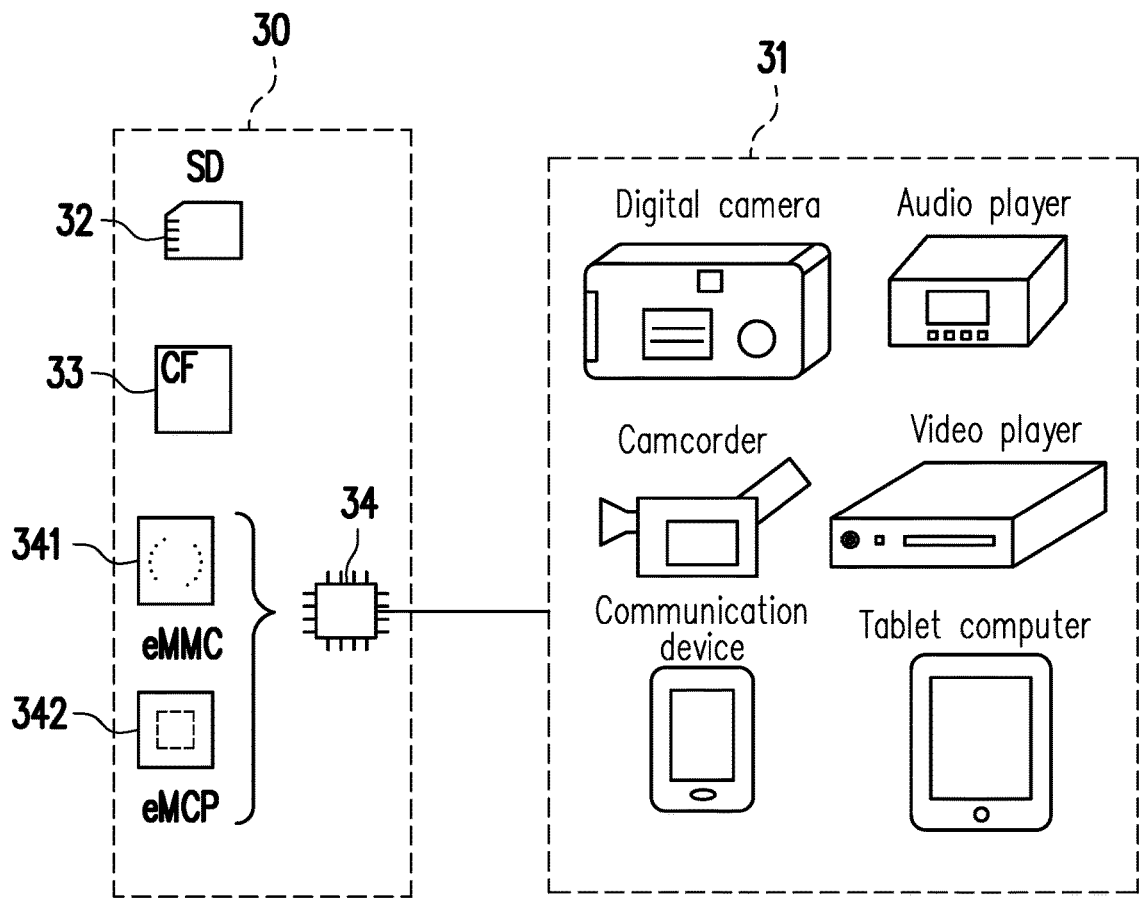
FIG. 3 is a schematic diagram of a host system and a memory storage device shown according to another exemplary embodiment of the invention.

FIG. 3 is a schematic of a host system and a memory storage device shown according to an exemplary embodiment of the invention.

Referring to FIG. 3, the memory storage device 30 may be used in conjunction with the host system 31 to store data. For example, the host system 31 may be a system such as a digital camera, a camcorder, a communication device, an audio player, a video player, or a tablet computer. For example, the memory storage device 30 may be various non-volatile memory storage devices such as a Secure Digital (SD) card 32, a Compact Flash (CF) card 33, or an embedded storage device 34 used by the host system 31. The embedded storage device 34 includes various types of embedded storage devices for which a memory module is directly coupled on the substrate of the host system, such as an embedded multimedia card (eMMC) 341 and/or an embedded multi-chip package (eMCP) storage device 342.

Figure 4:
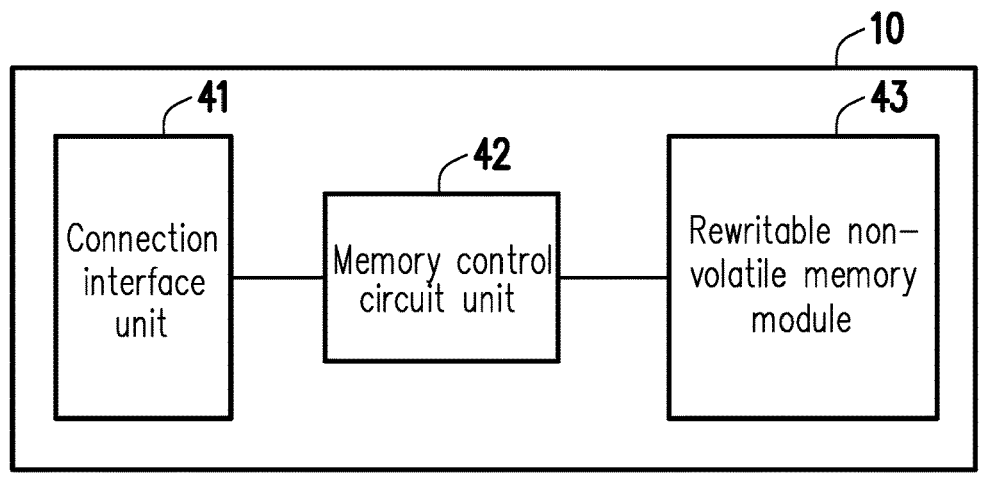
FIG. 4 is a schematic block diagram of a memory storage device shown according to an exemplary embodiment of the invention.

FIG. 4 is a schematic diagram of a memory storage device shown according to an exemplary embodiment of the invention.

Referring to FIG. 4, the memory storage device 10 includes a connection interface unit 41, a memory control circuit unit 42, and a rewritable non-volatile memory module 43.

The connection interface unit 41 is configured to couple the memory storage device 10 to the host system 11. The memory storage device 10 may be communicated with the host system 11 via the connection interface unit 41. In an exemplary embodiment, the connection interface unit 41 is compatible with Peripheral Component Interconnect Express (PCI Express) standard. In an exemplary embodiment, the connection interface unit 41 may also be compatible with Serial Advanced Technology Attachment (SATA) standard, Parallel Advanced Technology Attachment (PATA) standard, Institute of Electrical and Electronic Engineers (IEEE) 1394 standard, Universal Serial Bus (USB) standard, SD interface standard, Ultra High Speed-I (UHS-I) interface standard, Ultra High Speed-II (UHS-II) interface standard, Memory Stick (MS) interface standard, MCP interface standard, MMC interface standard, eMMC interface standard, Universal Flash Storage (UFS) interface standard, eMCP interface standard, CF interface standard, Integrated Device Electronics (IDE) standard, or other suitable standards. The connection interface unit 41 may be sealed in a chip with the memory control circuit unit 42. Alternatively, the connection interface unit 41 is disposed outside of a chip containing the memory control circuit unit 42.

The memory control circuit unit 42 is coupled to the connection interface unit 41 and the rewritable non-volatile memory module 43. The memory control circuit unit 42 is configured to perform a plurality of logic gates or control commands implemented in a hardware form or in a firmware form. The memory control circuit unit 404 also performs operations such as writing, reading, and erasing data in the rewritable non-volatile memory storage module 43 according to the commands of the host system 11.

The rewritable non-volatile memory module 43 is configured to store the data written by the host system 11. The rewritable non-volatile memory module 43 may include a single-level cell (SLC) NAND-type flash memory module (that is, a flash memory module that may store 1 bit in one memory cell), a multi-level cell (MLC) NAND-type flash memory module (that is, a flash memory module that may store 2 bits in one memory cell), a triple-level cell (TLC) NAND-type flash memory module (i.e., a flash memory module that may store 3 bits in one memory cell), a quad-level cell (QLC) NAND-type flash memory module (that is, a flash memory module that may store 4 bits in one memory cell), other flash memory modules, or other memory modules with the same characteristics.

Each of the memory cells in the rewritable non-volatile memory module 43 stores one or a plurality of bits via the change in voltage (also referred to as threshold voltage hereinafter). Specifically, a charge-trapping layer is disposed between the control gate and the channel of each of the memory cells. By applying a write voltage to the control gate, the number of electrons of the charge-trapping layer may be changed, and therefore the threshold voltage of the memory cells may be changed. This operation of changing the threshold voltage of the memory cells is also referred to as "writing data to the memory cells" or "programming the memory cells". As the threshold voltage is changed, each of the memory cells in the rewritable non-volatile memory module 43 has a plurality of storage states. Which storage state one memory cell belongs to may be determined via the application of a read voltage, so as to obtain one or a plurality of bits stored by the memory cell.

In an exemplary embodiment, the memory cells of the rewritable non-volatile memory module 43 may form a plurality of physical programming units, and these physical programming units may form a plurality of physical erasing units. Specifically, the memory cells on the same word line may form one or a plurality of physical programming units. If one memory cell may store two or more bits, the physical programming units on the same word line may at least be classified into lower physical programming units and upper physical programming units. For example, the least significant bit (LSB) of a memory cell belongs to the lower physical programming units, and the most significant bit (MSB) of a memory cell belongs to the upper physical programming units. Generally, in an MLC NAND-type flash memory, the write speed of the lower physical programming units is greater than the write speed of the upper physical programming units, and/or the reliability of the lower physical programming units is greater than the reliability of the upper physical programming units.

In an exemplary embodiment, the physical programming unit is the smallest unit of programming. That is, the physical programming unit is the smallest unit of data writing. For example, the physical programming unit may be a physical page or a physical sector. If the physical programming unit is a physical page, then the physical programming units may include a data bit area and a redundancy bit area. The data bit area contains a plurality of physical sectors configured to store user data, and the redundancy bit area is configured to store system data (for example, management data such as an ECC). In an exemplary embodiment, the data bit area contains 32 physical sectors, and the size of one physical sector is 512 bytes (B). However, in other exemplary embodiments, the data bit area may also contain 8, 16, or a greater or lesser number of physical sectors, and the size of each of the physical sectors may also be greater or smaller. Moreover, the physical erasing unit is the smallest unit of erasing. That is, each of the physical erase units contains the smallest number of memory cells erased together. For example, the physical erasing unit is a physical block.

Figure 5:
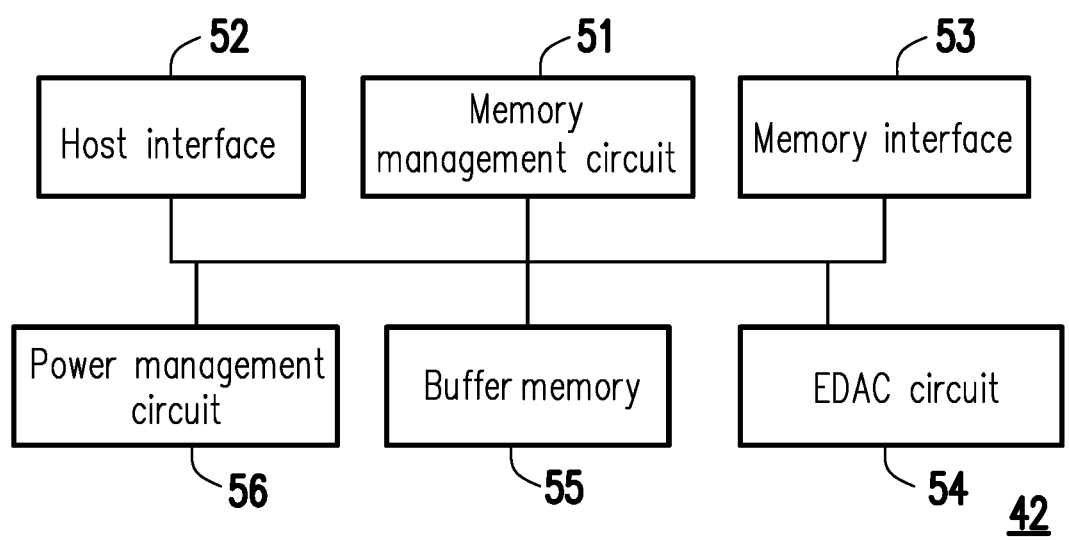
FIG. 5 is a schematic block diagram of a memory control circuit unit shown according to an exemplary embodiment of the invention.

FIG. 5 is a schematic diagram of a memory control circuit unit shown according to an exemplary embodiment of the invention.

Referring to FIG. 5, the memory control circuit unit 42 includes a memory management circuit 51, a host interface 52, and a memory interface 53. The memory management circuit 51 is configured to control the overall operation of the memory control circuit unit 42. Specifically, the memory management circuit 51 has a plurality of control commands. During the operation of the memory storage device 10, the control commands are executed to perform operations such as writing, reading, and erasing data. In the following, descriptions relating to the operation of the memory management circuit 51 are equivalent to the descriptions of the operation of the memory control circuit unit 42.

In an exemplary embodiment, the control commands of the memory management circuit 51 are implemented in a firmware form. For example, the memory management circuit 51 has a microprocessor unit (not shown) and a read-only memory (not shown), and the control commands are burned into a ROM. During the operation of the memory storage device 10, the control commands are executed by the microprocessor unit to perform operations such as writing, reading, and erasing data.

In an exemplary embodiment, the control commands of the memory management circuit 51 may also be stored in the form of program codes in a specific area (for example, the system area in a memory module exclusively configured to store system data) of the rewritable non-volatile memory module 43. Moreover, the memory management circuit 51 has a microprocessor unit (not shown), a ROM (not shown), and a RAM (not shown). In particular, the ROM has a boot code, and when the memory control circuit unit 42 is enabled, the microprocessor unit first executes the boot code to load the control commands stored in the rewritable non-volatile memory module 43 into the RAM of the memory management circuit 51. Next, the microprocessor unit runs the control commands to perform operations such as writing, reading, and erasing data.

In an exemplary embodiment, the control commands of the memory management circuit 51 may also be implemented in a hardware form. For example, the memory management circuit 51 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage the memory cells or memory cell groups of the rewritable non-volatile memory module 43. The memory write circuit is configured to issue a write command sequence to the rewritable non-volatile memory module 43 to write data into the rewritable non-volatile memory module 43. The memory read circuit is configured to issue a read command sequence to the rewritable non-volatile memory module 43 to read data from the rewritable non-volatile memory module 43. The memory erase circuit is configured to issue an erase command sequence to the rewritable non-volatile memory module 43 to erase data from the rewritable non-volatile memory module 43. The data processing circuit is configured to process data to be written into the rewritable non-volatile memory module 43 and data read from the rewritable non-volatile memory module 43. The write command sequence, the read command sequence, and the erase command sequence may independently include one or a plurality of program codes or command codes and be configured to instruct the rewritable non-volatile memory module 43 to perform corresponding operations such as writing, reading, and erasing. In an exemplary embodiment, the memory management circuit 51 may also issue other types of command sequences to the rewritable non-volatile memory module 43 to instruct the performance of corresponding operations.

The host interface 52 is coupled to the memory management circuit 51. The memory management circuit 51 may be communicated with the host system 11 via the host interface 52. The host interface 52 may be used to receive and identify commands and data sent by the host system 11. For example, the commands and data sent by the host system 11 may be sent to the memory management circuit 51 via the host interface 52. In addition, the memory management circuit 51 may send data to the host system 11 via the host interface 52. In the present exemplary embodiment, the host interface 52 is compatible with the PCI Express standard. However, it should be understood that the invention is not limited thereto, and the host interface 52 may also be compatible with the SATA standard, PATA standard, IEEE 1394 standard, USB standard, SD standard, UHS-I standard, UHS-II standard, MS standard, MMC standard, eMMC standard, UFS standard, CF standard, IDE standard, or other suitable standards for data transmission.

The memory interface 53 is coupled to the memory management circuit 51 and configured to access the rewritable non-volatile memory module 43. For example, the memory management circuit 51 may access the rewritable non-volatile memory module 43 via the memory interface 53. In other words, data to be written into the rewritable non-volatile memory module 43 is converted to a format acceptable to the rewritable non-volatile memory module 43 via the memory interface 53. Specifically, if the memory management circuit 51 is to access the rewritable non-volatile memory module 43, the memory interface 53 sends a corresponding command sequence. For example, the command sequences may include a write command sequence instructing data writing, a read command sequence instructing data reading, an erase command sequence instructing data erasing, and corresponding command sequences configured to instruct various memory operations (such as changing read voltage level or performing a garbage collection operation). The command sequences are generated by, for example, the memory management circuit 51 and sent to the rewritable non-volatile memory module 43 via the memory interface 53. The command sequences may include one or a plurality of signals or data on a bus. The signals or data may include a command code or a program code. For example, when reading a command sequence, information such as read identification code or memory address is included.

In an exemplary embodiment, the memory control circuit unit 42 further includes an error detection and correction (EDAC) circuit 54, a buffer memory 55, and a power management circuit 56.

The EDAC circuit 54 is coupled to the memory management circuit 51 and configured to execute an error detection and correction operation to ensure the correctness of data. Specifically, when the memory management circuit 51 receives a write command from the host system 11, the EDAC circuit 54 generates a corresponding error correcting code (ECC) and/or an error detecting code (EDC) for data corresponding to the write command, and the memory management circuit 51 writes the data corresponding to the write command and the corresponding ECC and/or EDC into the rewritable non-volatile memory module 43. Next, when reading data from the rewritable non-volatile memory module 43, the memory management circuit 51 reads the ECC and/or the EDC corresponding to the data at the same time, and the EDAC circuit 54 executes an error detection and correction operation on the read data based on the ECC and/or the EDC.

The buffer memory 55 is coupled to the memory management circuit 51 and configured to temporarily store data. The power management circuit 56 is coupled to the memory management circuit 51 and configured to control the power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 51 of FIG. 5 may include a flash memory management circuit.

Figure 6:
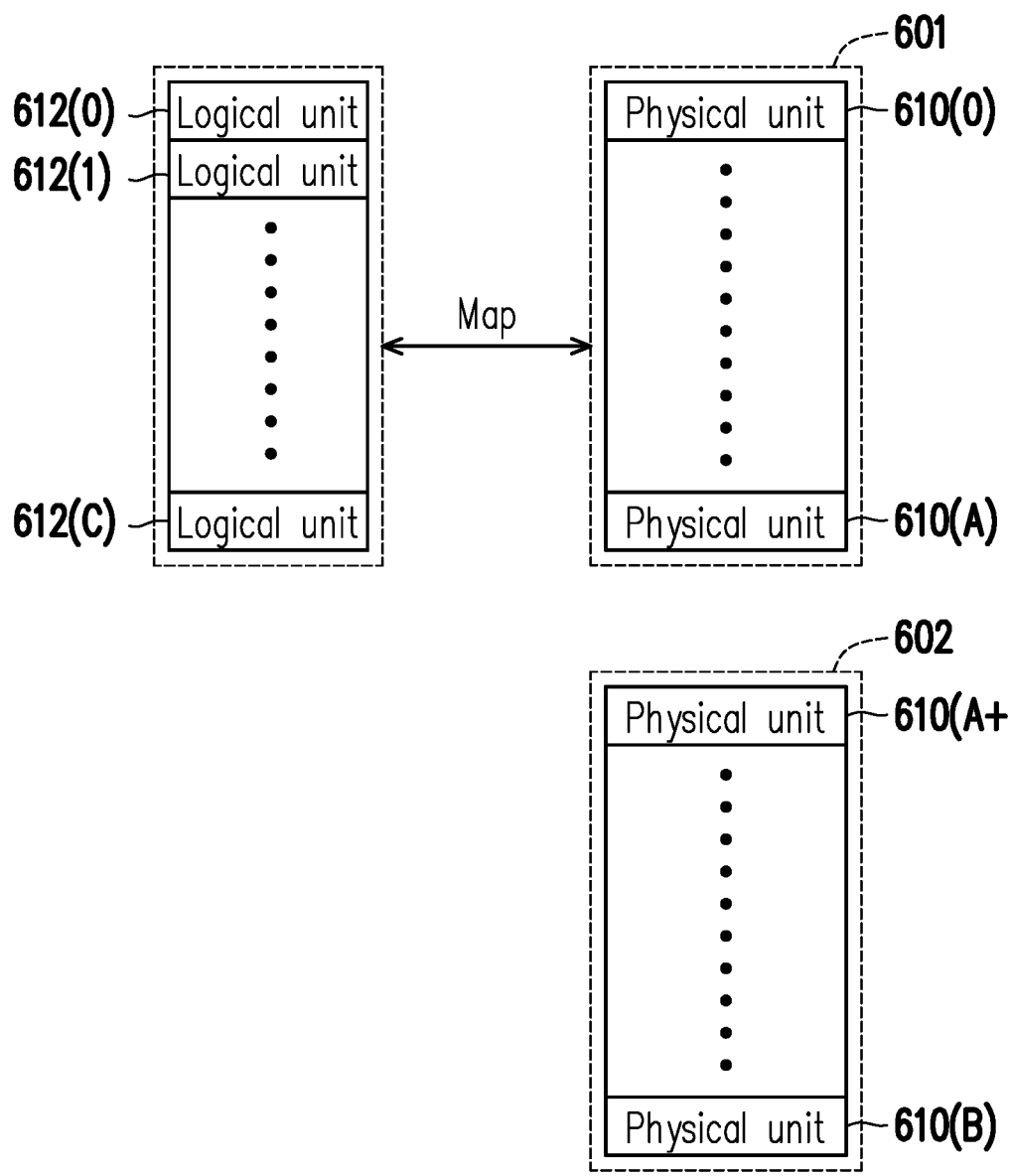
FIG. 6 is a schematic diagram of the management of a rewritable non-volatile memory module shown according to an exemplary embodiment of the invention.

FIG. 6 is a schematic diagram of the management of a rewritable non-volatile memory module shown according to an exemplary embodiment of the invention.

Referring to FIG. 6, the memory management circuit 51 may logically group physical units 610(0) to 610(B) in the rewritable non-volatile memory module 43 into a storage area 601 and a spare area 602. Each of the first physical units may include one or a plurality of physical programming units.

The physical units 610(0) to 610(A) in the storage area 601 are configured to store user data (for example, user data from the host system 11 in FIG. 1). For example, the physical units 610(0) to 610(A) in the storage area 601 may store valid data and/or invalid data. The physical units 610(A+1) to 610(B) in the spare area 602 do not store data (for example, valid data). For example, if a certain physical unit does not store valid data, this physical unit may be associated (or added) to the spare area 602. In addition, the physical units in the spare area 602 (or physical units that do not store valid data) may be erased. When writing new data, one or a plurality of physical units may be extracted from the spare area 602 to store the new data. In an exemplary embodiment, the spare area 602 is also referred to as a free pool.

The memory management circuit 51 may configure logical units 612(0) to 612(C) to map the physical units 610(0) to 610(A) in the storage area 601. In an exemplary embodiment, each of the logical units corresponds to one logical address. For example, one logical address may include one or a plurality of logical block addresses (LBAs) or other logical management units. In an exemplary embodiment, one logical unit may also correspond to one logical programming unit or formed by a plurality of continuous or discontinuous logical addresses.

It should be mentioned that, one logical unit may be mapped to one or a plurality of physical units. If a certain physical unit is currently mapped by a certain logical unit, the data currently stored in this physical unit includes valid data. On the other hand, if a certain physical unit is not currently mapped by any logical unit, the data currently stored in this physical unit is invalid data.

The memory management circuit 51 may record the management data describing the mapping relationship between logical units and physical units (also referred to as logical-to-physical mapping information) in at least one logical-to-physical mapping table. When the host system 11 is to read data from the memory storage device 10 or write data to the memory storage device 10, the memory management circuit 51 may access the rewritable non-volatile memory module 43 according to the information in the logical-to-physical mapping table.

In the following exemplary embodiments, a TLC NAND flash memory module is used as the type of the rewritable non-volatile memory module 43 for illustration. However, in another exemplary embodiment, the same or similar operations may also be applied to QLC NAND type or other types of flash memory modules.

In an exemplary embodiment, before certain data (also referred to as raw data) is stored to one or a plurality of physical units (also referred to as first physical units) in the rewritable non-volatile memory module 43, the memory management circuit 51 performs one randomization operation on the raw data to randomize the raw data into another data (also referred to as first data). For example, after the randomization operation, the quantities of bits "0" and "1" in the first data may tend to be identical (that is, equal or close).

In an exemplary embodiment, the memory management circuit 51 sends a write command sequence to the rewritable non-volatile memory module 43 to instruct the rewritable non-volatile memory module 43 to program the randomized raw data (namely the first data) into a plurality of memory cells (also referred to as first memory cells) in the first physical unit. Accordingly, the programmed first memory cells may be attempted to be evenly programmed into storage bits "111", "110", "100", "101", "001", "000", "010", and "011".

In an exemplary embodiment, the raw data is from the host system 11 and carries data to be stored in the memory storage device 10. This raw data may be randomized before storage. In an exemplary embodiment, the number of bits of the raw data is the same as the number of bits of the first data.

Figure 7:
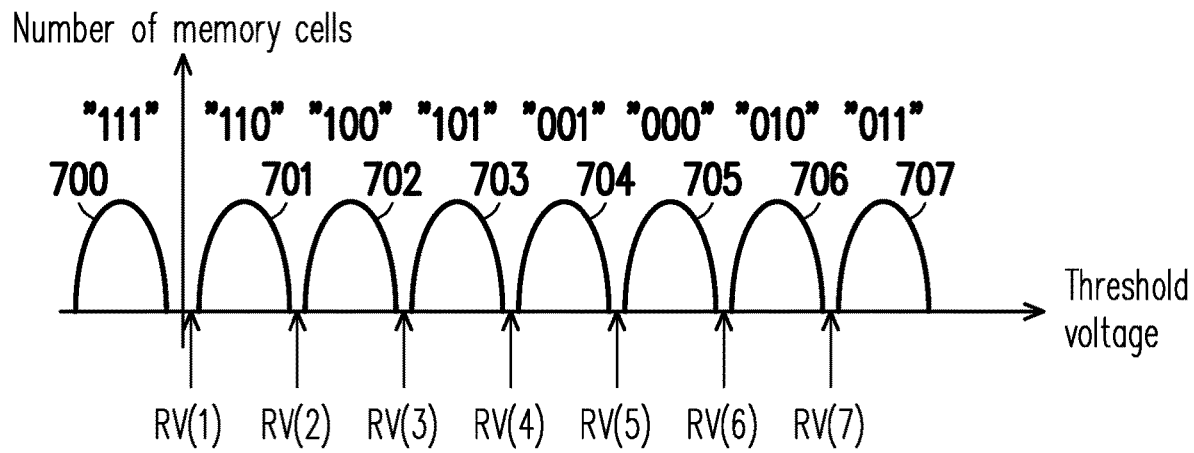
FIG. 7 is a schematic diagram of threshold voltage distribution of a memory cell shown according to an exemplary embodiment of the invention.
Figure 7:
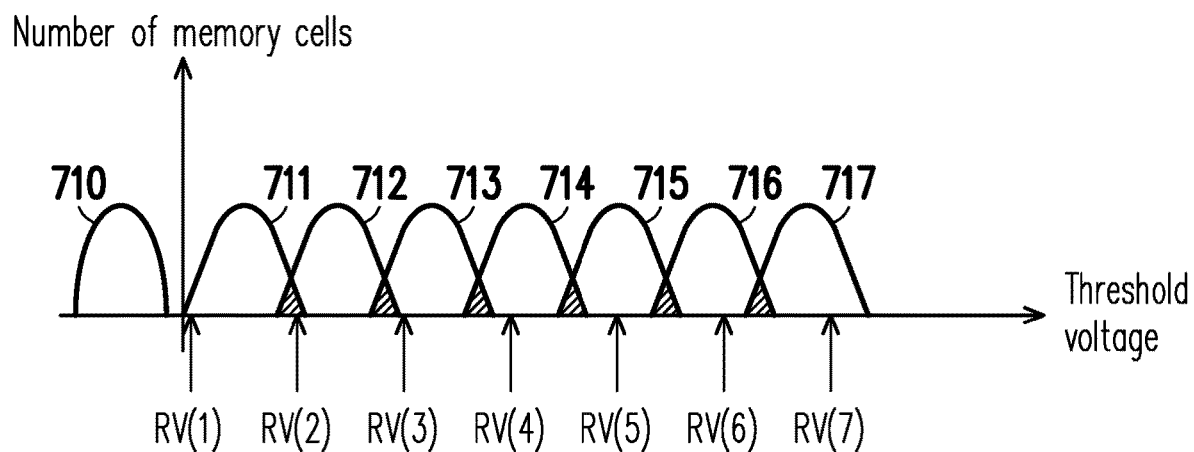

FIG. 7 is a schematic diagram of threshold voltage distribution of a memory cell shown according to an exemplary embodiment of the invention. It should be noted that FIG. 7 shows the threshold voltage distribution of the programmed first memory cells after the first memory cells in the rewritable non-volatile memory module 43 are programmed according to the first data. In FIG. 7, the horizontal axis represents the threshold voltage of the memory cells, and the vertical axis represents the number of memory cells.

Referring to FIG. 7, the programmed first memory cells may have 8 states 700 to 707. The memory cells belonging to the state 700 may be configured to store bits "111". The memory cells belonging to the state 701 may be configured to store bits "110". The memory cells belonging to the state 702 may be configured to store bits "100". The memory cells belonging to the state 703 may be configured to store bits "101". The memory cells belonging to the state 704 may be configured to store bits "001". The memory cells belonging to the state 705 may be configured to store bits "000". The memory cells belonging to the state 706 may be configured to store bits "010". The memory cells belonging to the state 707 may be configured to store bits "011". In other words, the states 700 to 707 correspond to default bit values "111", "110", "100", "101", "001", "000", "010", and "011", respectively. However, in another exemplary embodiment, the number of the states 700 to 707 may be adjusted, and the default bit value corresponding to each state may also be adjusted.

In an exemplary embodiment, it is assumed that the programmed plurality of first memory cells may be evenly distributed to the states 700 to 707. That is, if the total number of the first memory cells is N, and the total number of the states 700 to 707 is M (i.e., 8), then the total number of memory cells belonging to each state in the states 700 to 707 is default as N/M (i.e., N/8).

When data is to be read, the read voltage levels RV(1) to RV(7) may be applied to the first memory cells to read the data stored in at least a portion of the first memory cells. In other words, by sequentially applying the read voltage levels RV(1) to RV(7) to the first memory cells, a certain memory cell in the first memory cells may be determined to belong to one of the states 700 to 707, thus obtaining the data stored in the memory cell. For example, after the read voltage levels RV(1) to RV(7) are sequentially applied to the first memory cells, if a certain memory cell may be conducted by the read voltage level RV(5) but not by the read voltage level RV(4), the threshold voltage of the memory cell is between the read voltage levels RV(4) and RV(5). Therefore, it may be determined that the memory cell belongs to the state 704 and is configured to store the bits "001".

However, as the usage time of the first memory cells is increased and/or the operating environment is changed, performance degradation of the first memory cells may occur. After performance degradation occurs, the states 700 to 707 may gradually approach each other or even overlap each other. Additionally, the states 700 to 707 may also become flatter. For example, the states 710 to 717 may be configured to represent the threshold voltage distribution of the first memory cells after performance degradation.

After performance degradation occurs, the read voltage levels RV(1) to RV(7) are significantly shifted relative to the states 710 to 717, as shown in FIG. 7. If the uncorrected reading voltage levels RV(1) to RV(7) are continuously used to read the first memory cells, the states of many memory cells are misjudged, so that there are many errors in the data read from the first memory cells. If the read data contains too many errors, the data may not be successfully decoded and output.

In addition, due to the greater number of states in the first memory cells, each state is very close to each other and occupies a narrower voltage range, and therefore the difficulty of correcting the read voltage level may be greater. In some cases, it may even be possible to move the corrected read voltage level further away from the correct voltage position after the read voltage level correction is performed. Taking the read voltage level RV(6) of FIG. 7 as an example, the read voltage level RV(6) is originally located at a voltage position between the states 705 and 706, but after the performance degradation of the memory cells occurs, the read voltage level RV(6) is closer to the state 717. Therefore, if a common read voltage correction mechanism is used, the read voltage level RV(6) may be erroneously corrected to a voltage position between the states 716 and 717. Accordingly, the corrected read voltage level RV(6) may be further away from the correct voltage position (i.e., the voltage position between the states 715 and 716). Then, if the corrected read voltage level RV(6) is used to read data from the first memory cells, the number of read error bits may be even greater.

In an exemplary embodiment, the memory management circuit 51 may correct at least one of the read voltage levels RV(1) to RV(7) based on various voltage adjustment modes. For example, the plurality of voltage adjustment modes may include a first voltage adjustment mode and a second voltage adjustment mode, described one by one below.

First Voltage Adjustment Mode

In the first voltage adjustment mode, the memory management circuit 51 may send one or a plurality of read command sequences (also referred to as first read command sequence) to the rewritable non-volatile memory module 43. The first read command sequence may be configured to instruct the rewritable non-volatile memory module 43 to use a certain read voltage level (also referred to as first read voltage level) to read the programmed first memory cells to obtain the count information (also referred to as first count information). Then, the memory management circuit 51 may adjust the first read voltage level according to the first count information and the default count information corresponding to the first read voltage level.

In an exemplary embodiment, the first count information corresponding to the first read voltage level may reflect the total number of at least one memory cell that may be conducted by the first read voltage level in the programmed first memory cells. For example, if the threshold voltage of a certain memory cell in the first memory cells is less than the first read voltage level, then this memory cell should be conducted by the first read voltage level. On the other hand, if the threshold voltage of a certain memory cell in the first memory cells is not less than the first read voltage level, then this memory cell may be not conducted by the first read voltage level. Or, from another perspective, the first count information corresponding to the first read voltage level may reflect the total number of memory cells having a threshold voltage less than (or not greater than) the first read voltage level in the programmed first memory cells.

In an exemplary embodiment, after the programmed first memory cells are read using the first read voltage level, the rewritable non-volatile memory module 43 may report the read result corresponding to the first read voltage level to the memory management circuit 51. According to the read result, the memory management circuit 51 may obtain the first count information corresponding to the first read voltage level. For example, the read result may carry information that may reflect whether each memory cell in the first memory cells is conducted by the first read voltage level. According to this information, the memory management circuit 51 may obtain the first count information.

Figures 8, 9:
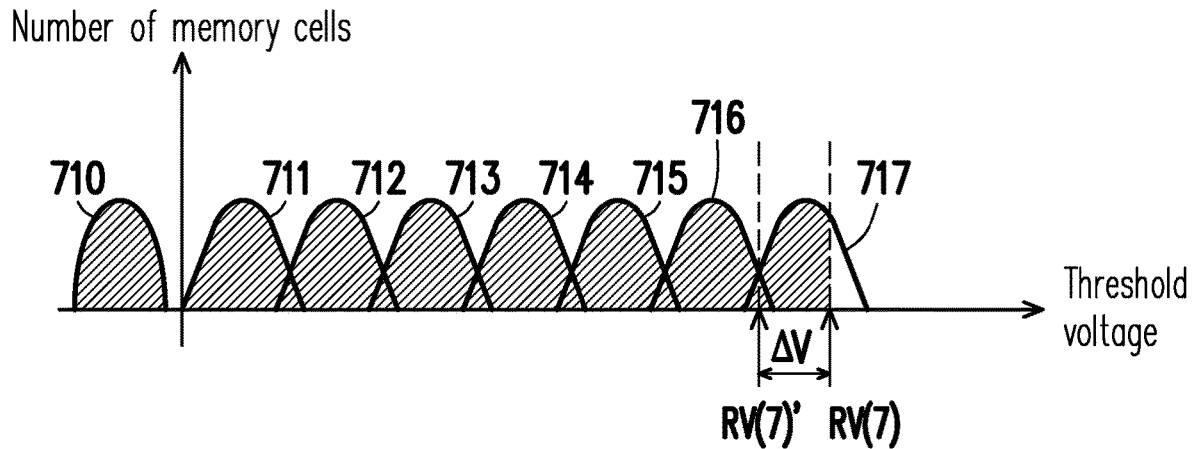
FIG. 8 is a schematic diagram of correcting a read voltage shown according to an exemplary embodiment of the invention.
FIG. 9 is a schematic diagram of default count information and compensation information corresponding to different read voltage levels shown according to an exemplary embodiment of the invention.

FIG. 8 is a schematic diagram of correcting a read voltage level shown according to an exemplary embodiment of the invention.

Referring to FIG. 8, it is assumed that the first read voltage level is the read voltage level RV(7). After the first read command sequence is sent to instruct the rewritable non-volatile memory module 43 to read the first memory cells using the read voltage level RV(7), first count information corresponding to the read voltage level RV(7) may be obtained. For example, the first count information corresponding to the read voltage level RV(7) may reflect, in the programmed first memory cells, the total number of at least one memory cell having a threshold voltage less than the read voltage level RV(7), and/or the total number of the memory cells that may be conducted by the read voltage level RV(7) in the programmed first memory cells. Taking FIG. 8 as an example, the first count information corresponding to the read voltage level RV(7) may reflect the total number of memory cells covered by the area marked with oblique lines. For example, assuming that 1000 memory cells in the first memory cells may be conducted by the read voltage level RV(7), the first count information may include a value of 1000.

In an exemplary embodiment, the default count information corresponding to the first read voltage level may reflect a default number (also referred to as an ideal number) of memory cells belonging to at least one default state in the programmed first memory cells. For example, the default number may be positively correlated to the total number of the first memory cells, and the default number may be negatively correlated with the total number of states to which the first memory cells belong.

FIG. 9 is a schematic diagram of default count information and compensation information corresponding to different read voltage levels shown according to an exemplary embodiment of the invention.

Referring to FIG. 7 and FIG. 9, the management table 901 may record the default count information respectively corresponding to the read voltage levels RV(1) to RV(7), and the read voltage levels RV(1) to RV(7) may respectively correspond to index value 1 to 7. In the management table 901, N represents the total number of first memory cells, and M represents the total number (i.e., 8) of the states 700 to 707 (or the states 710 to 717). For example, assuming that the first read voltage level is the read voltage level RV(i), the default count information corresponding to the read voltage level RV(i) may be $i \times (N/8)$.

In an exemplary embodiment, the memory management circuit 51 may obtain the default count information corresponding to the read voltage level RV(i) according to the following equation (1):

$$C = i \times (N/M) \quad (1)$$

In Equation (1), the parameter C represents the default count information corresponding to the read voltage level RV(i), the parameter i represents the index value corresponding to the read voltage level RV(i), the parameter N represents the total number of the first memory cells, and the parameter M represents the total number of the plurality of states to which the first memory cells belong. The memory management circuit 51 may establish the management table 901 according to Equation (1).

In an exemplary embodiment, the difference between the first count information corresponding to the first read voltage level and the default count information corresponding to the first read voltage level may reflect the shift degree of the threshold voltage distribution of the first memory cells relative to the first read voltage level. For example, the difference may be directly related to the shift degree of the threshold voltage distribution of the first memory cells relative to the first read voltage level. That is, if the difference is greater, the threshold voltage distribution of the first memory cells is shifted more. In addition, the positive or negative value of the difference may reflect that the voltage value of the first read voltage level needs to be increased or decreased when the first read voltage level is corrected.

In an exemplary embodiment, the memory management circuit 51 may determine an adjustment value (also referred to as a first adjustment value) according to the first count information corresponding to the first read voltage level and the default count information corresponding to the first read voltage level. The first adjustment value may be set according to the difference between the first count information corresponding to the first read voltage level and the default count information corresponding to the first read voltage level. For example, the first adjustment value may be positively related to the difference. That is, if the difference is greater, the first adjustment value may be greater.

Taking FIG. 8 as an example, the first adjustment value may include an adjustment value ΔV. According to the first count information corresponding to the read voltage level RV(7) and the default count information corresponding to the read voltage level RV(7), the adjustment value ΔV may be obtained. For example, the memory management circuit 51 may obtain the adjustment value ΔV according to the difference between the first count information corresponding to the read voltage level RV(7) and the default count information corresponding to the read voltage level RV(7). For example, the memory management circuit 51 may substitute the difference into a function or query a data table according to the difference to obtain the adjustment value ΔV. For example, this function or table of data may be created based on historical experience. Then, the memory management circuit 51 may adjust the read voltage level RV(7) according to the adjustment value ΔV. For example, when the first count information (for example, 1000) corresponding to the read voltage level RV(7) is greater than the default count information (for example, 900) corresponding to the read voltage level RV(7), the memory management circuit 51 may subtract the adjustment value ΔV from the voltage value of the read voltage level RV(7) to obtain a new read voltage level RV(7)'. Compared with the read voltage level RV(7), the new read voltage level RV(7)' is closer to the boundary position between the states 716 and 717. Therefore, compared with the read voltage level RV(7), using the new read voltage level RV(7)' to read data from the first memory cells may effectively reduce the number of error bits in the data.

It should be noted that in the above exemplary embodiment, it is assumed that the programmed plurality of first memory cells may be evenly and perfectly distributed to the states 700 to 707 of FIG. 7, so that the total number of memory cells belonging to each state in the states 700 to 707 is default as N/M (i.e., N/8). However, in practical applications, random algorithms used to perform randomization operations on raw data often may not achieve complete randomization. Therefore, even after the randomization operation, the actual number of memory cells belonging to each of the states 700 to 707 may be (N/8) plus an error value. This error value may be positive or negative. In other words, limited by the flaws of the random algorithm itself adopted in the randomization operation, in the programmed first memory cells, the actual number of memory cells belonging to each state in the states 700 to 707 may be different (e.g., different from N/8). Such a difference may result in lower correction efficiency for the read voltage levels RV(1) to RV(7).

In an exemplary embodiment, the memory management circuit 51 may correct at least one of the read voltage levels RV(1) to RV(7) based on the second voltage adjustment mode. In particular, compared to the first voltage adjustment mode, in the second voltage adjustment mode, the memory management circuit 51 may further consider the error value to improve the correction efficiency of the read voltage levels RV(1) to RV(7). The operation details of the second voltage adjustment mode are described in detail below.

Second Voltage Adjustment Mode

Compared to the first voltage adjustment mode, in the second voltage adjustment mode, the memory management circuit 51 may also obtain compensation information (also referred to as first compensation information) corresponding to the first read voltage level. The first compensation information may reflect a deviation in evenly programming the first memory cells to a plurality of states. Then, the memory management circuit 51 may adjust the first read voltage level according to the first count information, the first compensation information, and the default count information corresponding to the first read voltage level.

In an exemplary embodiment, the first compensation information corresponding to the first read voltage level may reflect, in the programmed first memory cells, the difference (i.e., the error value) between the default number and the actual number of memory cells belonging to at least one default state. For example, assuming that the first read voltage level is the read voltage level RV(1), the default state may include the state 700; assuming that the first read voltage level is the read voltage level RV(2), the default state may include the states 700 and 701; and so on, assuming that the first read voltage level is the read voltage level RV(7), the default states may include the states 700 to 706.

In an exemplary embodiment, the memory management circuit 51 may record the state to which each memory cell in the first memory cells belongs (e.g., one of the states 700 to 707). For example, after a randomization operation is performed on the raw data to obtain the first data, the memory management circuit 51 may record the state to which each memory cell in the first memory cells to be programmed to store the first data belongs to. Alternatively, when a programming operation is performed on the first memory cells, the memory management circuit 51 may synchronously record the state to which each memory cell in the first memory cells belongs. The memory management circuit 51 may count the actual number of memory cells included in each state according to the recorded state to which each memory cell in the first memory cells belongs. Then, according to the difference between the default number (for example, N/8) and the actual number (for example, N/8 plus an error value) of memory cells corresponding to each state, the memory management circuit 51 may obtain first compensation information corresponding to the first read voltage level.

In an exemplary embodiment, the memory management circuit 51 may scan the threshold voltage distribution of the programmed first memory cells to obtain a voltage interval where the threshold voltage of each memory cell in the first memory cells is located. For example, in the process of scanning the threshold voltage distribution of the first memory cells, the memory management circuit 51 may instruct the rewritable non-volatile memory module 43 to read the programmed first memory cells and obtain the threshold voltage of each memory cell in the first memory cells according to the read result. According to the voltage interval where the threshold voltage of each memory cell in the first memory cells is located, the memory management circuit 51 may count the actual number of memory cells contained in each state in the threshold voltage distribution of the first memory cells. Then, according to the difference between the default number (for example, N/8) and the actual number (for example, N/8 plus an error value) of memory cells corresponding to each state, the memory management circuit 51 may also obtain first compensation information corresponding to the first read voltage level.

Please refer further to FIG. 9. In an exemplary embodiment, the memory management circuit 51 may record the compensation information $\Delta S(1)$ to $\Delta S(7)$ respectively corresponding to the read voltage levels RV(1) to RV(7) in the management table 901. Next, the memory management circuit 51 may read the compensation information $\Delta S(i)$ corresponding to the read voltage level RV(i) from the management table 901. For example, the compensation information $\Delta S(7)$ corresponding to the read voltage level RV(7) may reflect the difference between the default number and the actual number of memory cells belonging to the states 701 to 706 in the programmed first memory cells.

In an exemplary embodiment, the memory management circuit 51 may determine one adjustment value (also referred to as second adjustment value) according to the first count information, the first compensation information, and the default count information corresponding to the first read voltage level. For example, the second adjustment value may be set according to the first compensation information and the difference between the first count information and the default count information corresponding to the first read voltage level. Similar to the first adjustment value, the second adjustment value may be directly related to the difference.

In an exemplary embodiment, the memory management circuit 51 may correct the default count information corresponding to the first read voltage level according to the first compensation information. For example, the memory management circuit 51 may add the first compensation information to the default count information corresponding to the first read voltage level to obtain the corrected default count information. The memory management circuit 51 may obtain the difference between the first count information and the corrected default count information. Then, the memory management circuit 51 may adjust the first read voltage level according to the difference.

Taking the read voltage level RV(7) as an example, it is assumed that the first count information, the default count information, and the first compensation information corresponding to the read voltage level RV(7) are values of 1000, 900, and 8, respectively. The memory management circuit 51 may obtain, according to the sum of the default count information and the first compensation information, the actual number of memory cells belonging to the states 700 to 706 in the programmed first memory cells is 908 (that is, 900+8=908). Then, the memory management circuit 51 may determine the second adjustment value according to the difference between the first count information and the actual number (i.e., 1000−908=92). For example, the second adjustment value may also include the adjustment value $\Delta V$ of FIG. 8. For example, the memory management circuit 51 may substitute the difference into a function or query a data table according to the difference to obtain the adjustment value $\Delta V$. Then, the memory management circuit 51 may adjust the read voltage level RV(7) to the read voltage level RV(7)' according to the adjustment value $\Delta V$.

It should be noted that, in comparison to the first adjustment value, in the second voltage adjustment mode, the second adjustment value is also affected by the first compensation information, so as to improve or overcome the defect that the first memory cells are not evenly programmed to the plurality of states. Therefore, in an exemplary embodiment, compared with the first adjustment value, the first read voltage level may be corrected more accurately by using the second adjustment value, thereby improving the correction efficiency for the first read voltage level.

FIG. 10 is a schematic diagram of recording compensation information corresponding to different word lines shown according to an exemplary embodiment of the invention.

Referring to FIG. 10, in an exemplary embodiment, the memory management circuit 51 may record the compensation information $\Delta S(1)$ to $\Delta S(7)$ respectively corresponding to the plurality of read voltage levels RV(1) to RV(7) of a word line WL(i) in a management table 1001, as shown in FIG. 10. Then, when data is to be read from a plurality of memory cells (i.e., the first memory cells) on the word line WL(i), the compensation information $\Delta S(1)$ to $\Delta S(7)$ may be used to correct the read voltage levels RV(1) to RV(7) corresponding to the word line WL(i) to improve the accuracy of the data read from the word line WL(i). The management table 1001 may be stored in a physical erasing unit, a virtual block, or other physical management units where the word line WL(i) is located.

In an exemplary embodiment, the memory management circuit 51 may update at least one of the compensation information $\Delta S(1)$ to $\Delta S(7)$ in response to programming the word line WL(i) (or the first memory cells). Accordingly, even if the degree of distribution of the first memory cells in the plurality of states (such as the states 700 to 707 or 710 to 717) is different after each programming, the updated compensation information $\Delta S(1)$ to $\Delta S(7)$ may all correctly reflect the current distributed state of the programmed first memory cells in the plurality of states.

In an exemplary embodiment, when data is read from the word line WL(i) (or the first memory cells), the memory management circuit 51 may first attempt to adjust the read voltage level based on the first voltage adjustment mode (i.e., without considering the compensation information $\Delta S(1)$ to $\Delta S(7)$) and read data from the word line WL(i) (or the first memory cells) using the adjusted read voltage level. However, if one or a plurality of voltage adjustments performed based on the first voltage adjustment mode still may not successfully decode the read data, the memory management circuit 51 may instead attempt to adjust the read voltage level based on the second voltage adjustment mode (i.e., considering the compensation information $\Delta S(1)$ to $\Delta S(7)$), so as to further improve the correction efficiency of the read voltage.

In an exemplary embodiment, the memory management circuit 51 may also determine that the current adjustment of the read voltage level is to be performed based on the first voltage adjustment mode or the second voltage adjustment mode according to other determination parameters (such as bit error rate, programming count, erase count, read count, and/or ambient temperature of the first memory cells), etc. For example, in response to a certain determination parameter being not greater than the threshold value, the memory management circuit 51 may adopt the first voltage adjustment mode to adjust the read voltage level. Or, in response to a certain determination parameter being greater than the threshold value, the memory management circuit 51 may adopt the second voltage adjustment mode to adjust the read voltage level. The details of the operation of the first voltage adjustment mode and the second voltage adjustment mode are all described in detail above, and are not repeated herein.

FIG. 11 is a flowchart of a read voltage adjustment method shown according to an exemplary embodiment of the invention.

Please refer to FIG. 11, in step S1101, a write command sequence is sent, wherein the write command sequence instructs to program a plurality of first memory cells in a rewritable non-volatile memory module. In step S1102, a first read command sequence is sent, wherein the first read command sequence is configured to instruct the rewritable non-volatile memory module to read the programmed first memory cells using a first read voltage level to obtain first count information. In step S1103, first compensation information corresponding to the first read voltage level is obtained. In step S1104, the first read voltage level is adjusted according to the first count information, the first compensation information, and default count information corresponding to the first read voltage level.

However, each step in FIG. 11 is as described in detail above, and is not repeated herein. It should be mentioned that, each step in FIG. 11 may be implemented as a plurality of program codes or circuits, and the invention is not limited thereto. Moreover, the method of FIG. 11 may be used with the above exemplary embodiments, and may also be used alone, and the invention is not limited thereto.

Based on the above, after the first memory cells are read using a specific voltage level to obtain an approximate number of memory cells that may be conducted by the voltage level, the voltage level of the read voltage may be corrected and adjusted according to the approximate number and corresponding compensation information. In particular, the compensation information may reflect the deviation in evenly programming the first memory cells to the plurality of states, and/or the compensation information may be configured to improve or overcome the defect of the first memory cells not evenly programmed to the plurality of states. Thereby, the correction efficiency of the read voltage may be effectively improved.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A read voltage adjustment method, configured for a rewritable non-volatile memory module, wherein the rewritable non-volatile memory module comprises a plurality of memory cells, and the read voltage adjustment method comprises:
   sending a write command sequence, wherein the write command sequence instructs to program a plurality of first memory cells in the plurality of memory cells;
   sending a first read command sequence, wherein the first read command sequence instructs to read the programmed plurality of first memory cells using a first read voltage level to obtain first count information;
   obtaining first compensation information corresponding to the first read voltage level, and the first compensation information reflects a deviation in evenly programming the plurality of first memory cells to a plurality of states; and
   adjusting the first read voltage level according to the first count information, the first compensation information, and default count information corresponding to the first read voltage level.

2. The read voltage adjustment method of claim 1, wherein the first count information reflects a total number of memory cells that may be conducted by the first read voltage level in the programmed plurality of first memory cells.

3. The read voltage adjustment method of claim 1, wherein the default count information reflects a default number of memory cells belonging to at least one default state in the programmed plurality of first memory cells.

4. The read voltage adjustment method of claim 3, wherein the first compensation information reflects a difference between the default number and an actual number of the memory cells belonging to the at least one default state in the programmed plurality of first memory cells.

5. The read voltage adjustment method of claim 1, further comprising:
   scanning a threshold voltage distribution of the plurality of first memory cells to obtain the first compensation information.

6. The read voltage adjustment method of claim 1, wherein the step of adjusting the first read voltage level according to the first count information, the first compensation information, and the default count information corresponding to the first read voltage level comprises:
   correcting the default count information according to the first compensation information;
   obtaining a difference between the first count information and the corrected default count information; and
   adjusting the first read voltage level according to the difference.

7. The read voltage adjustment method of claim 1, further comprising:
   recording the first compensation information in a management table; and
   updating the first compensation information in response to programming the plurality of first memory cells.

8. A memory storage device, comprising:
   a connection interface unit configured to be coupled to a host system;
   a rewritable non-volatile memory module, wherein the rewritable non-volatile memory module comprises a plurality of memory cells; and
   a memory control circuit unit coupled to the connection interface unit and the rewritable non-volatile memory module,
   wherein the memory control circuit unit is configured to:
   send a write command sequence, wherein the write command sequence instructs to program a plurality of first memory cells in the plurality of memory cells;
   send a first read command sequence, wherein the first read command sequence instructs to read the programmed plurality of first memory cells using a first read voltage level to obtain first count information;
   obtain first compensation information corresponding to the first read voltage level, and the first compensation information reflects a deviation in evenly programming the plurality of first memory cells to a plurality of states; and
   adjust the first read voltage level according to the first count information, the first compensation information, and default count information corresponding to the first read voltage level.

9. The memory storage device of claim 8, wherein the first count information reflects a total number of memory cells that may be conducted by the first read voltage level in the programmed plurality of first memory cells.

10. The memory storage device of claim 8, wherein the default count information reflects a default number of memory cells belonging to at least one default state in the programmed plurality of first memory cells.

11. The memory storage device of claim 10, wherein the first compensation information reflects a difference between the default number and an actual number of the memory cells belonging to the at least one default state in the programmed plurality of first memory cells.

12. The memory storage device of claim 8, wherein the memory control circuit unit is further configured to:
scan a threshold voltage distribution of the plurality of first memory cells to obtain the first compensation information.

13. The memory storage device of claim 8, wherein the operation of the memory control circuit unit adjusting the first read voltage level according to the first count information, the first compensation information, and the default count information corresponding to the first read voltage level comprises:
correcting the default count information according to the first compensation information;
obtaining a difference between the first count information and the corrected default count information; and
adjusting the first read voltage level according to the difference.

14. The memory storage device of claim 8, wherein the memory control circuit unit is further configured to:
record the first compensation information in a management table; and
update the first compensation information in response to programming the plurality of first memory cells.

15. A memory control circuit unit, configured to control a rewritable non-volatile memory module, the memory control circuit unit comprising:
a host interface configured to be coupled to a host system;
a memory interface configured to be coupled to a rewritable non-volatile memory module, wherein the rewritable non-volatile memory module comprises a plurality of memory cells; and
a memory management circuit coupled to the host interface and the memory interface,
wherein the memory management circuit is configured to:
send a write command sequence, wherein the write command sequence instructs to program a plurality of first memory cells in the plurality of memory cells;
send a first read command sequence, wherein the first read command sequence instructs to read the programmed plurality of first memory cells using a first read voltage level to obtain first count information;
obtain first compensation information corresponding to the first read voltage level, and the first compensation information reflects a deviation in evenly programming the plurality of first memory cells to a plurality of states; and
adjust the first read voltage level according to the first count information, the first compensation information, and default count information corresponding to the first read voltage level.

16. The memory control circuit unit of claim 15, wherein the first count information reflects a total number of memory cells that may be conducted by the first read voltage level in the programmed plurality of first memory cells.

17. The memory control circuit unit of claim 15, wherein the default count information reflects a default number of memory cells belonging to at least one default state in the programmed plurality of first memory cells.

18. The memory control circuit unit of claim 17, wherein the first compensation information reflects a difference between the default number and an actual number of the memory cells belonging to the at least one default state in the programmed plurality of first memory cells.

19. The memory control circuit unit of claim 15, wherein the memory management circuit is further configured to:
scan a threshold voltage distribution of the plurality of first memory cells to obtain the first compensation information.

20. The memory management circuit of claim 15, wherein the operation of the memory management circuit adjusting the first read voltage level according to the first count information, the first compensation information, and the default count information corresponding to the first read voltage level comprises:
correcting the default count information according to the first compensation information;
obtaining a difference between the first count information and the corrected default count information; and
adjusting the first read voltage level according to the difference.

21. The memory control circuit unit of claim 15, wherein the memory management circuit is further configured to:
record the first compensation information in a management table; and
update the first compensation information in response to programming the plurality of first memory cells.

* * * * *